(12) United States Patent
Kennedy

(10) Patent No.: US 9,086,148 B2
(45) Date of Patent: Jul. 21, 2015

(54) SLIDING ELEMENT, IN PARTICULAR PISTON RING, HAVING A COATING AND PROCESS FOR PRODUCING A SLIDING ELEMENT

(75) Inventor: Marcus Kennedy, Dusseldorf (DE)

(73) Assignee: Federal-Mogul Burscheid GmbH, Burscheid (DE)

( * ) Notice: Subject to any disclaimer, the term of this patent is extended or adjusted under 35 U.S.C. 154(b) by 244 days.

(21) Appl. No.: 13/637,526

(22) PCT Filed: Oct. 13, 2011

(86) PCT No.: PCT/EP2011/067885
§ 371 (c)(1),
(2), (4) Date: Feb. 4, 2013

(87) PCT Pub. No.: WO2012/100847
PCT Pub. Date: Aug. 2, 2012

(65) Prior Publication Data
US 2013/0140776 A1 Jun. 6, 2013

(30) Foreign Application Priority Data

Jan. 27, 2011 (DE) .......................... 10 2011 003 254

(51) Int. Cl.
| | |
|---|---|
| C23C 16/44 | (2006.01) |
| F16J 9/26 | (2006.01) |
| C23C 14/02 | (2006.01) |
| C23C 14/06 | (2006.01) |
| C23C 14/32 | (2006.01) |
| B05D 3/00 | (2006.01) |
| C23C 28/00 | (2006.01) |

(52) U.S. Cl.
CPC . F16J 9/26 (2013.01); B05D 3/002 (2013.01); B05D 3/007 (2013.01); C23C 14/025 (2013.01); C23C 14/0605 (2013.01); C23C 14/325 (2013.01); C23C 16/44 (2013.01); C23C 28/00 (2013.01)

(58) Field of Classification Search
USPC .................. 277/442; 428/336, 446, 447, 408; 427/577, 299, 331, 404, 405; 204/192.1, 192.15, 192.16
See application file for complete search history.

(56) References Cited

U.S. PATENT DOCUMENTS

| | | | | |
|---|---|---|---|---|
| 5,941,647 | A * | 8/1999 | Koike et al. ................. | 384/907.1 |
| 6,231,956 | B1 | 5/2001 | Brenner et al. | |
| 6,299,425 | B1 * | 10/2001 | Hirano et al. ................. | 428/408 |
| 6,558,757 | B1 | 5/2003 | Scheibe et al. | |
| 7,273,655 | B2 * | 9/2007 | Miyake et al. ................. | 428/408 |
| 7,406,940 | B2 * | 8/2008 | Nishimura et al. ........ | 123/193.6 |
| 7,458,585 | B2 * | 12/2008 | Hamada et al. ................. | 427/577 |
| 7,493,882 | B2 * | 2/2009 | Hiraishi et al. ............ | 123/193.6 |
| 7,820,293 | B2 * | 10/2010 | Dekempeneer ................. | 428/408 |
| 8,033,550 | B2 * | 10/2011 | Jacquet et al. ................. | 428/408 |
| 8,119,240 | B2 * | 2/2012 | Cooper .......................... | 428/408 |
| 8,304,063 | B2 * | 11/2012 | Ito et al. .......................... | 428/336 |
| 8,641,046 | B2 * | 2/2014 | Hoppe et al. ................... | 428/336 |
| 2007/0224349 | A1 * | 9/2007 | Hosenfeldt et al. ........ | 427/249.1 |
| 2008/0053396 | A1 | 3/2008 | Hiraishi et al. | |
| 2011/0101620 | A1 | 5/2011 | Hoppe et al. | |
| 2012/0068418 | A1 | 3/2012 | Hoppe et al. | |
| 2013/0136861 | A1 * | 5/2013 | Barenreuter et al. .... | 427/249.18 |

FOREIGN PATENT DOCUMENTS

| | | | |
|---|---|---|---|
| CN | 101432462 | A | 5/2009 |
| DE | 3901401 | A1 | 9/1989 |
| DE | 4006456 | C1 | 5/1991 |
| DE | 4040456 | A1 | 6/1992 |
| DE | 19735962 | A1 | 3/1998 |
| DE | 19850217 | C1 | 3/2000 |
| DE | 19850218 | C1 | 3/2000 |
| DE | 10240337 | A1 | 4/2004 |
| DE | 102005063123 | B3 | 5/2007 |
| DE | 102007060091 | A1 | 6/2009 |
| DE | 102008016864 | B3 | 10/2009 |
| DE | 102008022039 | A1 | 11/2009 |
| EP | 724023 | B1 | 7/1996 |
| EP | 1829986 | B1 | 9/2007 |
| JP | 2004-137535 | * | 5/2004 |
| JP | 2008057478 | A | 3/2008 |
| JP | 2008297477 | A | 12/2008 |
| JP | 2009504448 | A | 2/2009 |
| JP | 2013029190 | A | 2/2013 |
| JP | 2013029191 | A | 2/2013 |
| RU | 2007147662 | A | 6/2009 |
| WO | 2006125683 | A1 | 11/2006 |

(Continued)

OTHER PUBLICATIONS

Holmeberg et al "Tribological Characteristics od Hydrogenated and Hydrogen-Free Diamond-like Carbon Coatings" Diamond Films & Technology vole 4, No. 2 (1994) p. 113-129.*

Ulrike Ratayski, et al., Effect of the carbon ion energy on the microstructure of ta C/Cr multilayers, Surface & Coating Technology, Elsevier, Dec. 25, 2011, vol. 206, pp. 1753-1817.

Jari Koskinen, et al., Friction reduction by texturing of DLC coatings sliding against steel under oil lubrication, Surface & Coatings Technology, Elsevier, Aug. 25, 2010, vol. 204.

(Continued)

*Primary Examiner* — Archene Turner
(74) *Attorney, Agent, or Firm* — Robert L. Stearns; Dickinson Wright, PLLC

(57) ABSTRACT

A sliding element, in particular piston ring, has on at least one running surface, from the inside outwards, a coating having a metal-containing adhesive layer and a hydrogen-free amorphous carbon layer with a thickness of at least 10 μm.

In a process for the production of a sliding element, in particular a piston ring, coating with a metal-containing adhesive layer and a hydrogen-free amorphous carbon layer in a thickness of at least 10 μm is carried out.

22 Claims, No Drawings

(56) References Cited

FOREIGN PATENT DOCUMENTS

| WO | 2007020139 A1 | 2/2007 |
|---|---|---|
| WO | WO-2007073788 A2 | 7/2007 |
| WO | WO-2007116861 A1 | 10/2007 |
| WO | 2009121719 A2 | 10/2009 |
| WO | 2010020274 A1 | 2/2010 |
| WO | 2010133384 A1 | 11/2010 |
| WO | 2011110411 A2 | 9/2011 |

OTHER PUBLICATIONS

Japenese Search Report mailed Aug. 7, 2013.
Manier, C-A, "Slip-rolling resistance of novel Zr(C,N) thin film coatings under high Hertzian contact pressures," BAM Dissertation Series, vol. 60 Feb. 11, 2010, pp. 1-138, XP55013961, Federal Institute for Materials Research and Testing, Berlin, Germany [DE] ISBN: 978-3-98-135503-1 Found on the Internet: http://www.bam.de/de/service/publikationen/publikationen_medien/disertationen/diss_60_vT.pdf.
Eryilmaz O et al: The effect of the sputter cleaning of steel substrates with neutral molecule source on the adhesion of TiN films, Surface and Coatings Technology, vol. 97, No. 1-3, Dec. 1, 1997, pp. 488-491, XP027367687, Elsevier, Amsterdam [NL] ISSN0257-8972, DOI: 10.1016/S0257-8972 (97) 00189-8.
Scheibe H et al: "Laser-induced vacuum arc (laser arc) and its application for deposition of hard amorphous carbon films ", Surface and Coatings Technology, vol. 74-75, Part No. 2, Oct. 1, 1995, pp. 813-818, XP55013859, Elsevier, Amsterdam [NL] ISSN: 0257-8972, DOI: 10.1016/0257-8972 (95) 08280-8.
International search report from PCT/EP2011/067885 mailed on Dec. 16, 2011.

* cited by examiner

SLIDING ELEMENT, IN PARTICULAR PISTON RING, HAVING A COATING AND PROCESS FOR PRODUCING A SLIDING ELEMENT

TECHNICAL FIELD

The invention relates to a sliding element, in particular a piston ring, having a coating on at least one running surface, and to a process for the production of a sliding element.

RELATED ART

Sliding elements, such as, for example, piston rings, pistons or cylinder liners, in combustion engines must work over a long lifetime both with as little friction as possible and with low wear. The friction, which in combustion engines is associated directly with the fuel consumption, can be kept low by coatings of DLC (diamond-like carbon). Furthermore, layer thicknesses of up to 40 µm can be achieved in principle. However, with layer thicknesses of more than 5 µm there is the problem that the layer properties, for example in respect of the structure and composition of the layer, change so that the required lifetime is not achieved. This is equally true for layer thicknesses of less than 5 µm.

Diamond-like carbon layers (DLC) are a metastable form of amorphous carbon with a significant proportion of $sp^3$-hybridised carbon. The provision of diamond-like carbon layers on various substrates in order to develop new components is nowadays carried out by means of different processes. The most well-known processes, with which sliding elements capable of being mass produced can be coated, are PA-CVD, sputtering, and the vacuum arc vapour deposition process (DE4006456). The layer systems which can be provided thereby conventionally contain hydrogen in the case of PA-CVD and are hydrogen-free in the case of sputtering or the vacuum arc vapour deposition process. A summary of the possible DLC layer systems is to be found in VDI Guideline 2840 *Carbon Films*.

TABLE 1 lists the documents that contribute towards the prior art within the context of this application. A distinction is made in the list between publications that are relevant to the process and those that are relevant to the product.

| Number | Year | Type | Important features |
|---|---|---|---|
| DE 3901401 | 1989 | DLC production/process | Method for controlling a vacuum arc vapour deposition process |
| DE 4006456 | 1990 | | Process for controlling a vacuum arc discharge |
| DE 10240337 | 2002 | | Device for separating particles, in which the absorber electrode is arranged in the shadow of the plasma that is produced and an (electro)magnetic field is generated in order to accelerate positive charge carriers |
| DE 19850217/ US 6558757 | 1998 | | Vacuum coating process, in which material is ionised from a target by means of a laser and reacts with a gas that is stored in the pores and is subsequently deposited on a substrate. |
| EP 1829986 | 2010 | | Process for machining surfaces having a coating of hard carbon |
| EP 0724023 | 1996 | DLC product | Hard, amorphous, hydrogen-free carbon layer (<0.5 at % H, module of elasticity >400 GPa, hardness >40 GPa, maximum layer thickness: a few µm, produced by means of vacuum arc |
| DE 102005063123B3 | 2005 | | Sliding element with wear protection and running-in layer, wherein the running-in layer contains hydrogen and nanocrystalline carbide phases. |
| DE 102008016864B3 | 2008 | | Piston ring having a DLC coating with a 3-ply layer system: adhesive layer, metal-containing amorphous carbon layer, metal-free amorphous carbon layer, resistance >5000 ohms |
| US 6231956 | 1997 | | Wear-resistant layer system consisting of a substrate of a titanium alloy, an intermediate layer and an amorphous carbon layer |
| DE 19735962A1 | 1997 | | Guide bush with hydrogen-containing DLC inner coating |
| DE 19850218 | 1998 | | Device and process for coating substrates *in vacuo* with a special absorber electrode which is so arranged that the particles are not deposited directly on the substrate. |
| WO 2006125683A1 | 2006 | | Piston ring having a 3-ply layer system consisting of a 1st layer from group IVB, VB or VIB (<1 µm), a 2nd layer of a diamond-like nanocomposite (<5 µm) and a 3rd layer of a diamond-like layer (layer thickness 0.1 µm-10 µm) |
| DE 102008022039 | 2008 | | Anti-wear coating of amorphous carbon layer having an oxygen content of 0.5 at %-25 at %. |

There is known from EP 0724023 a hydrogen-free (<0.5 at %) DLC coating having good friction behaviour under non-lubricated conditions as well as with reduced lubricant use. This layer has a hardness of >40 GPa and a modulus of elasticity of >400 GPa with a maximum thickness of a few µm.

There is known from DE 10 2005 063 123 B3 a sliding element having a DLC coating with good running-in behaviour. Because the lifetime is too short, permanently low friction cannot be ensured over the entire lifetime of the sliding element.

DE 10 2008 016 864 relates to a sliding element having a multi-ply coating which comprises, from the inside outwards, an adhesive layer, a metal- and hydrogen-containing DLC layer and a metal-free hydrogen-containing DLC layer.

DE 197 35 962 A1 discloses a guide bush and a process for forming a hard carbon film on the inner surface of the guide bush, in which a hard carbon film of hydrogenated, amorphous carbon is formed on the inner surface by a plasma CVD process.

WO 2006/125683 A1 discloses a piston ring which comprises, from the inside outwards, a layer containing an element of group IVB, VB or VIB, an intermediate layer having a diamond-like nanocomposite composition, and a DLC layer.

It is known that good wear values are achieved when the content of sp3-hybridised carbon atoms is as high as possible, in particular greater than 60 at %. Such layers are referred to as ta-C layers and can be produced by conventional sputtering procedures or so-called vacuum arc processes (cf. in this connection DE 40 40 456 C1 and DE 198 50 218 C1 from Table 1). Hydrogen-free ta-C coatings can be produced with a thickness of a few micrometres as oxygen-containing layers (cf., for example, the teaching of DE 10 2008 022 039 A1 from Table 1) and as oxygen- and hydrogen-free layers (cf. in this connection EP 0 724 023 A1).

Also known in this context are hard-material-based PVD coatings, which in most cases contain chromium nitride. Although such layers have the required wear resistance, they do not have the necessary low friction coefficients.

SUMMARY OF THE INVENTION

Against this background, a object underlying the invention is to provide a sliding element which is improved further in respect of the combination of friction coefficients and wear properties. A process for the production of such a sliding element is further to be provided.

An object of this invention is to provide a sliding element having a metal-containing adhesive layer as well as a ta-C type DLC coating with a suitable layer thickness, in order to ensure minimal losses of friction power during the entire lifetime of the component.

DETAILED DESCRIPTION

Consequently, the sliding element according to the invention has on at least one running surface, from the inside outwards, a coating having a metal-containing adhesive layer and a ta-C type DLC layer with a thickness of at least 10 μm. The metal-containing adhesive layer advantageously not only ensures adhesion of the DLC layer but can also equalise the internal stresses that occur in that layer. The minimum layer thickness of 10 μm ensures that the required wear resistance is obtained and additionally permits good friction values over the lifetime of the engine. In particular, the wear behaviour can be adapted both to the sliding element, in particular the piston ring itself, and to the counter body, such as, for example, the cylinder liner. The producibility of the coating according to the invention is ensured by the process steps described below, in particular the cleaning of the surface to be coated by a metal ion sputtering process, as well as the described production processes for the adhesive layer and the DLC layer. Consequently, a significantly improved sliding element can be provided.

One of the central requirements made of the sliding element, in particular the piston ring, consists in the provision of a coating which lasts for the lifetime of the element in order to ensure minimal losses of friction power throughout operation. In initial validations in an engine it was found that, although the wear achieved for the system taC-coated piston ring/AlSi running path was about 60% lower as compared with hydrogen-containing DLC-coated piston rings, a layer thickness of at least 10 μm is necessary depending on the application and sliding contact surfaces. The thickness of the coating as a whole is preferably up to about 20 μm.

In order to ensure sufficient layer adhesion in particular in the case of ta-C layer thicknesses greater than a few μm, it is further necessary to provide a metal-containing adhesive layer between the substrate and the DLC layer. At present, on the basis of initial findings, it is preferred for the adhesive layer to contain at least one of the following materials: chromium, titanium, chromium nitride and tungsten.

A thickness of from 0.1 μm to 1.0 μm has further been found to be advantageous for the adhesive layer.

Particularly good properties were further found when the DLC layer is substantially oxygen- and/or hydrogen-free, that is to say contains an amount of each of these elements of less than 0.5 at %.

The hardness and modulus of elasticity of the DLC layer also affect the tribological behaviour of the piston ring. During testing, a surface hardness of not more than 55 GPa with a modulus of elasticity of not more than 550 GPa has been found to be advantageous for the coating.

In contrast to the prior art it has further been found, in validations outside as well as inside the engine, that particularly good wear values are achieved when the DLC layer has an sp3 content of hybridised carbon atoms of at least 40 at %.

A purposive reduction of the $sp^3$ content in the outer 1 μm to 3 μm of the layer close to the edge leads to a further reduction of friction in running in and of the running-in time itself. In preliminary tests outside the engine, it was found that a further embodiment in which the outer 1 μm to 3 μm close to the edge were doped resulted in a further improvement in terms of heat resistance and burn mark behaviour under conditions of insufficient lubrication under maximum loads of up to 700 N.

The outer region of the DLC layer close to the edge having a thickness of from 1 μm to 3 μm can advantageously be doped with elements such as boron, oxygen and/or silicon.

In order in particular to ensure a low friction value, the running surface of the sliding element must be as smooth as possible. The DLC layer provided here preferably has in the coated state a roughness depth of Rz<6 μm and in the finished state a roughness depth of Rz<2 μm, in particular <1 μm, as well as a reduced peak depth of Rpk<0.3 μm, in particular <0.1 μm. In this connection, the measures from EP 1 829 986 A1 and DE 198 50 218 C1 are included in the subject-matter of the present application.

Cast iron or steel, which for particular applications can be nitrided, is preferred for the substrate and base material of the sliding element to be coated. With regard to cast material as the base material, the preferred forms are:
  unalloyed, untempered cast iron with lamellar graphite
  alloyed, heat-treated or not heat-treated grey cast iron with carbides
  spheroidal cast iron, tempered
  vermicular graphite cast iron, untempered
  cast steel (at least 11 wt. % chromium, tempered martensitic structure with embedded special carbides, nitrided or non-nitrided).

With regard to steel as the base material, the preferred forms are:
  chromium steel, at least 11 wt. % chromium, nitrided or non-nitrided
  chromium-silicon-carbon steel.

Tests in an engine have shown that a particularly good oil scraping action of the piston ring coated with the ta-C type DLC layer according to the invention is achieved by very small, "sharp" lower running edges. Therefore, it is further preferred that the lower running surface edge of a piston ring according to the invention has a radius of not more than 0.2 mm, preferably less than 0.1 mm.

The above-mentioned object is further achieved by the process described in claim 14 for the production of a sliding element, in particular a piston ring, in which coating with a metal-containing adhesive layer and a ta-C type DLC layer in a thickness of at least 10 μm is carried out. The production process of the vacuum laser arc process, which has already been described in various documents (see Table 1), has been improved within the context of this invention for the production of ta-C layers>10 μm in that an optimised adhesive layer in terms of material choice and layer thickness was used and the process parameters ensure process stability over the entire coating time. Preferred measures and the advantages which can be achieved by the process are apparent on the one hand from the preceding description of the sliding element according to the invention. It is further mentioned at this point that all the features described below in connection with the process can also be applied to the sliding element according to the invention.

On the other hand, it is mentioned that the adhesive layer can be formed particularly reliably by a sputtering process, a thermal vapour deposition process or an electrical vapour deposition process, such as, for example, an arc process.

As mentioned above, particular advantages are achieved in terms of the adhesion of the adhesive layer to the substrate of the sliding element if the surface to be coated is cleaned by a metal ion sputtering process.

The roughness of the finished coating can advantageously be reduced by lapping, belt and/or brush polishing.

The invention claimed is:

1. A sliding element which has on at least one running surface, from the inside outwards, a coating having a metal-containing adhesive layer and a tetrahedral hydrogen-free amorphous carbon layer with a thickness of at least 10 μm, wherein the tetrahedral hydrogen-free amorphous carbon has an sp3 content of hybridized carbon atoms of at least 40 at %, wherein the tetrahedral hydrogen-free amorphous carbon layer contains hydrogen in an amount of less than 0.5at %, and the sp3 content in the outer 1 μm to 3 μm of the tetrahedral hydrogen-free amorphous carbon layer is reduced.

2. The sliding element according to claim 1, wherein the adhesive layer contains at least one of the following materials: chromium, titanium, chromium nitride and/or tungsten.

3. The sliding element according to claim 1, wherein the adhesive layer has a thickness of from 0.1 μm to 1.0 μm.

4. The sliding element according to claim 1, wherein the tetrahedral hydrogen-free amorphous carbon layer contains oxygen in an amount of less than 0.5 at %.

5. The sliding element according to claim 1, wherein the hardness of the tetrahedral hydrogen-free amorphous carbon layer is not more than 55 GPa and the modulus of elasticity is not more than 550 GPa.

6. The sliding element according to claim 1, wherein an outer 1 μm to 3 μm of the tetrahedral hydrogen-free amorphous carbon layer is doped.

7. The sliding element according to claim 1, wherein an outer 1 μm to 3 μm of the tetrahedral hydrogen-free amorphous carbon layer is doped with at least one of the following elements: boron, oxygen and/or silicon.

8. The sliding element according to claim 1, wherein the coating has a roughness depth Rz of <6 μm.

9. The sliding element according to claim 1, wherein the coating has a reduced peak depth Rpk of <0.3 μm.

10. The sliding element according to claim 1, wherein the base material is cast iron or steel.

11. The sliding element according to claim 1, including a lower surface edge of the sliding element having a radius that is <0.1 mm.

12. A method for making a sliding element including applying a coating on a running surface of the sliding element with a metal-containing adhesive layer and a tetrahedral hydrogen-free amorphous carbon layer in a thickness of at least 10 μm wherein tetrahedral hydrogen-free amorphous carbon layer is formed to have sp3 content of hybridized carbon atoms of at least 40 at %, wherein the tetrahedral hydrogen-free amorphous carbon layer contains hydrogen in an amount of less than 0.5 at %, and reducing the sp3 content in the outer 1 μm to 3 μm of the tetrahedral hydrogen-free amorphous carbon layer.

13. The method according to claim 12, wherein the adhesive layer is formed by at least one of a sputtering process, a thermal vapour deposition process or an electrical vapour deposition process.

14. The method according to claim 12 wherein the tetrahedral hydrogen-free amorphous carbon layer is formed by means of a vacuum laser arc process.

15. The method according to claim 12, wherein the surface to be coated is cleaned by means of a metal ion sputtering process.

16. The method according to claim 12, wherein the coating is smoothed by lapping, belt and/or brush polishing after it has been formed.

17. The sliding element according to claim 1, comprising a piston ring.

18. The sliding element according to claim 1, wherein the coating has a roughness depth $R_z$ of <2 μm.

19. The sliding element according to claim 1, wherein the coating has a roughness depth $R_z$ of <1 μm.

20. The sliding element according to claim 1, including a lower surface edge of the sliding element having a radius that is 0.1 mm or less.

21. The method according to claim 12 wherein the sliding element is selected as a piston ring.

22. The method according to claim 12 wherein the adhesive layer is formed by an arc process.

* * * * *